United States Patent
Roger et al.

(10) Patent No.: US 9,373,614 B2
(45) Date of Patent: Jun. 21, 2016

(54) TRANSISTOR ASSEMBLY AS AN ESD PROTECTION MEASURE

(75) Inventors: Frederic Roger, Graz (AT); Wolfgang Reinprecht, Tobelbad (AT)

(73) Assignee: AMS AG, Unterpremstaetten (AT)

( * ) Notice: Subject to any disclaimer, the term of this patent is extended or adjusted under 35 U.S.C. 154(b) by 36 days.

(21) Appl. No.: 13/575,579

(22) PCT Filed: Jan. 10, 2011

(86) PCT No.: PCT/EP2011/050225
§ 371 (c)(1),
(2), (4) Date: Oct. 11, 2012

(87) PCT Pub. No.: WO2011/092050
PCT Pub. Date: Aug. 4, 2011

(65) Prior Publication Data
US 2013/0113036 A1     May 9, 2013

(30) Foreign Application Priority Data
Jan. 26, 2010   (DE) .......................... 10 2010 005 715

(51) Int. Cl.
*H01L 27/02* (2006.01)
*H01L 27/07* (2006.01)
*H01L 27/06* (2006.01)

(52) U.S. Cl.
CPC .......... *H01L 27/0255* (2013.01); *H01L 27/067* (2013.01); *H01L 27/0629* (2013.01); *H01L 27/0727* (2013.01)

(58) Field of Classification Search
CPC ............ H01L 27/0255; H01L 27/0629; H01L 27/0647; H01L 27/067; H01L 27/0711; H01L 27/0722; H01L 27/0727; H01L 27/0248

USPC ......................................................... 257/328
See application file for complete search history.

(56) References Cited

U.S. PATENT DOCUMENTS

| | | | |
|---|---|---|---|
| 5,329,143 A | 7/1994 | Chan et al. | |
| 5,751,042 A | 5/1998 | Yu | |
| 5,965,920 A | 10/1999 | Sung | |
| 6,169,309 B1 * | 1/2001 | Teggatz et al. | 257/328 |
| 7,659,558 B1 * | 2/2010 | Walker et al. | 257/173 |
| 2005/0275029 A1 * | 12/2005 | Watt | 257/355 |
| 2006/0022272 A1 * | 2/2006 | Chen | 257/355 |
| 2006/0065931 A1 | 3/2006 | Lee et al. | |
| 2006/0226499 A1 | 10/2006 | Shimizu | |
| 2006/0255411 A1 | 11/2006 | Suzuki et al. | |
| 2009/0032837 A1 | 2/2009 | Tseng et al. | |
| 2009/0167662 A1 | 7/2009 | Kao et al. | |

FOREIGN PATENT DOCUMENTS

| | | |
|---|---|---|
| CN | 101132021 A | 2/2008 |
| DE | 10 2005 027 368 | 12/2006 |
| JP | H08204020 A | 8/1996 |
| KR | 20000045486 A | 7/2000 |

* cited by examiner

*Primary Examiner* — Matthew W Such
*Assistant Examiner* — David Spalla
(74) *Attorney, Agent, or Firm* — McDermott Will & Emery LLP

(57) ABSTRACT

A diode (23) is arranged near a transistor (25) to protect from ESD. The diode comprises a well (5) of a first conductivity type and a doped region (4) of a second conductivity type in opposition to the first conductivity type. The transistor comprises a doped well (2) and a doped region (1) of the first conductivity type. The well (2) of the transistor is doped lower than the well (5) of the diode.

8 Claims, 1 Drawing Sheet

TRANSISTOR ASSEMBLY AS AN ESD PROTECTION MEASURE

RELATED APPLICATIONS

This application is a U.S. National Phase Application under 35 USC 371 of International Application PCT/EP2011/050225 filed Jan. 10, 2011.

This application claims the priority of European application No. 10 2010 005 715.0 filed Jan. 26, 2010, the entire content of which is hereby incorporated by reference.

FIELD OF THE INVENTION

The present invention relates to an arrangement with a transistor that is protected against electrostatic discharge.

BACKGROUND OF THE INVENTION

In electronic circuits, overvoltages due to electrostatic discharge (ESD) can occur, by which the components of the circuit are destroyed. Electronic circuits are therefore often provided with ESD protection devices.

U.S. Pat. No. 5,751,042 A describes an ESD protection circuit for two mutually adjacent n-channel components with $n^+$ regions for source and drain. The drain $n^+$ region of the first n-channel component is connected to a positive terminal of a supply voltage, and the source $n^+$ region of the second n-channel component is connected to a negative terminal of the supply voltage. The drain $n^+$ region of the first n-channel component is arranged a distance away from the source of the $n^+$ region of the second n-channel component and is isolated by a field oxide region. An n-type well, which increases the breakdown voltage at the pn junction, substantially overlaps the drain $n^+$ region of the first n-channel component and extends up to the source $n^+$ region of the second n-channel component. The well extends deeper into the substrate than the $n^+$ regions and has a lower dopant concentration than the $n^+$ regions.

As another possibility, this publication indicates the arrangement of a $p^+$-type guard ring between the drain $n^+$ region of the first n-channel component and the source $n^+$ region of the second n-channel component. This is intended to reduce the current gain of the parasitic npn-bipolar transistor formed between the two n-channel components and thus prevent a so-called snap-back triggered by an electrostatic discharge.

SUMMARY OF THE INVENTION

One object of the present invention is to provide a transistor component that can be effectively protected from damage due to the occurrence of an electrostatic discharge.

This and other objects are attained in accordance with one aspect of the present invention directed to a transistor assembly comprising: a transistor that has a well of a first conductivity type and a doped region of the first conductivity type arranged outside the well, and a diode that has an additional well of the first conductivity type and a doped region of a second conductivity type opposite to the first conductivity type arranged outside the additional well. The doped region of the diode is arranged between the diode well and the doped region of the transistor, and the transistor well and the diode well are electroconductively connected to one another. There is a sufficiently small distance between the doped region of the transistor and the diode well, and the transistor well has a sufficiently lower doping than the diode well that a bipolar transistor formed between the transistor well as collector, the doped region of the diode as base and the doped region of the transistor as emitter has a lower current gain than a bipolar transistor formed by the diode well as collector, the doped region of the diode as base and the doped region of the transistor as emitter.

In the transistor assembly, a diode is arranged in the vicinity of the transistor for protection against ESD. The transistor comprises a doped well of a first conductivity type (n-type or p-type) and at least one doped region of the first conductivity type arranged outside the well. Conductivity type is to be understood in the description below and in the claims to mean only n-type or p-type, but not to refer to the level of doping (dopant concentration). The diode comprises at least one doped well of the first conductivity type and at least one doped region of the second conductivity type opposite the first conductivity type arranged outside of the well, i.e., p-type if the well is n-type and n-type if the well is p-type. The doped region of the diode is arranged between the diode well and the doped region of the transistor. The transistor well and the diode well are electroconductively connected to one another. The well of the transistor as the collector, the doped region of the diode as the base and the doped region of the transistor as the emitter form a parasitic bipolar transistor, i.e., a bipolar transistor not formed intentionally by the structure of the transistor.

The well of the transistor is provided with a lower doping than the well of the diode. There is such a small distance between the doped region of the transistor and the well of the diode that the parasitic bipolar transistor has a lower current gain due to the different doping of the wells than does an additional bipolar transistor formed by the well of the diode as the collector, the doped region of the diode as the base and the doped region of the transistor as the emitter.

If an electrostatic discharge occurs in a transistor component without a protective diode, and causes an undesired flow of current between the well of the transistor and the surrounding semiconductor material, the parasitic bipolar transistor can be activated at the voltages applied to the transistor in operation, and a drastic increase of current intensity known as snap-back occurs, by which the transistor is destroyed. Due to the greater current gain of the additional parasitic bipolar transistor formed by the diode, the current intensity appearing in the transistor is reduced, however, and the transistor is protected from destruction. To achieve this, the dopant concentrations in the well of the transistor and in the well of the diode and the distance between the transistor and the diode are suitably adjusted.

In one embodiment of the transistor assembly, the first conductivity type is n-type and the second conductivity type is p-type.

In another embodiment, the wells and the doped regions of the diode and the transistor are arranged in a substrate made of semiconductor material of the second conductivity type.

In another embodiment, electrically conductive contact connections with connection conductors and contact pads are provided above the substrate. One of these connection conductors is arranged on a contact area of the transistor well and another of these connection conductors is arranged on a contact area of the diode well.

In another embodiment, the connection conductors are formed in finger shapes in parallel, and the contact connections are interdigitated with one another in this manner.

In another embodiment, the well of the transistor is provided as the drain and the doped region of the transistor as the source.

In another embodiment, the transistor has an additional doped region of the first conductivity type on the side of the well facing away from the doped region and electroconductively connected to the doped region. The additional doped region is likewise arranged outside the well.

In another embodiment, the diode has an additional doped region of the second conductivity type on the side of the well facing away from the doped region and electroconductively connected to the doped region. The additional doped region is likewise arranged outside the well.

In another embodiment, an additional diode is arranged as a protective diode on the side of the transistor facing away from the diode, and the arrangement of the transistor and the diodes is mirror-symmetrical with respect to a plane of symmetry running through the well of the transistor.

In another embodiment, the well of the diode has a doping that is at least twice as high as the doping of the transistor well.

The transistor can be, for example, a high-voltage NMOS transistor.

BRIEF DESCRIPTION OF THE DRAWINGS

A more precise description of examples of the transistor assembly follows, with reference to the appended figures.

DETAILED DESCRIPTION OF THE DRAWINGS

Figure 1:
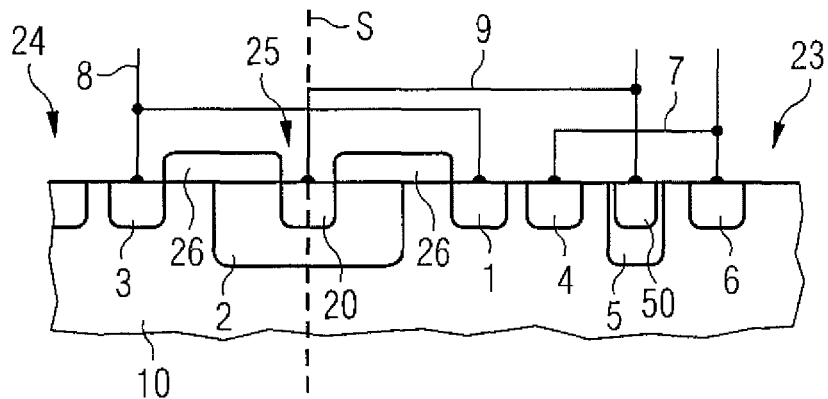
FIG. 1 shows a cross section of an embodiment.

FIG. 1 shows a cross section through an embodiment of the transistor assembly. Doped wells and doped regions are formed on the upper side of the substrate 10 of semiconductor material. A first doped region 1 of the transistor 25 has a first conductivity type and is provided, for example, as the source of the transistor 25. A doped well 2 likewise has the first conductivity type and is provided, for example, as the drain of the transistor 25. The doped well 2 can be provided with a more highly doped contact area 20, with which an ohmic contact for an external electrical terminal is realized. In addition, an additional doped region 3 of the first conductivity type for the source of the transistor is provided in the illustrated embodiment. The doped regions 1, 3 can be electroconductively connected to one another over the upper side of the substrate 10. In one embodiment, the doped regions 1, 3 inside the substrate 10 form a contiguous doped region; the sectional planes of the doped regions 1, 3 shown in FIG. 1 are also separated from one another in this embodiment.

The doped well 2 and the doped regions 1, 3 for source and drain are arranged spaced away from one another in such a manner that a channel region is provided in the semiconductor material of the substrate 10 between the source and drain and can be controlled during operation of the transistor with a gate electrode 26 arranged above the channel. A thin gate dielectric is formed between the gate electrode 26 and the semiconductor material of the substrate 10. The dimensions of the gate electrode 26 in the cross section of FIG. 1 indicate that the doped regions 1, 3 and the contact area 20 can be formed self-aligned with respect to the gate electrode 26.

The diode 23 provided as a protective diode is formed by a doped well 5 of the first conductivity type and a doped region 4 of the conductivity type opposite to the first conductivity type. The doped region 4 is arranged between the well 5 of the diode 23 and the doped region 1 of the transistor 25. In addition, an additional doped region 6 of the second conductivity type is provided for the diode 23 in the illustrated embodiment. The doped regions 4, 6 can be electroconductively connected over the upper side of the substrate 10 and/or inside the substrate 10. In particular, the first conductivity type can be n-type and the second conductivity type can be p-type. In this case, the well 5 forms the cathode of the diode and the doped regions 4, 6 form the anode of the diode. The doped well 5 can be provided with a more highly doped contact area 50, with which an ohmic contact for an external electrical terminal is realized.

A first contact connection 7, a second contact connection 8 and a third contact connection 9 are schematically drawn in FIG. 1. These contact connections 7, 8, 9 are preferably formed on the upper side of the substrate 10 by printed conductors. Instead of that or additionally, electrically conductive connections can also be performed inside the semiconductor material of the substrate 10 by appropriately doped regions.

In the illustrated embodiment, the first contact connection 7 connects the two doped regions 4, 6 of the second conductivity type for diode 23 to one another. These connections can simultaneously be provided as a substrate contact if the substrate 10 has a weak doping of the second conductivity type, for example. The second contact connection 8 connects the doped regions 1, 3 of the transistor, which are provided as the source. The third contact connection 9 connects the well 2 provided as the drain of the transistor 25 to the well 5 of the first conductivity type in diode 23.

The different conductivity types of the wells 2, 5, the doped regions 1, 3, 4, 6 and the substrate 10 cause parasitic bipolar transistors to form in the structure of the component. A first bipolar transistor is formed by the source and drain of the transistor 25 and the oppositely doped semiconductor material of the substrate 10 and the diode 23. The well 2 is the collector and the doped region 1 is the emitter of this first parasitic bipolar transistor; the base is formed by the semiconductor material of the substrate 10, doped oppositely to the source and drain, or by the doped regions 4, 6 of the second conductivity type in diode 23. A second parasitic bipolar transistor has the same base and the same emitter as the first parasitic bipolar transistor, and it has the well 5 of the first conductivity type in diode 23 as its collector. Since the well 2 of the transistor 25 is doped lower than the well 5 of the diode 23, the first parasitic bipolar transistor has a lower current gain than the second parasitic bipolar transistor, so that a current flows principally through the diode 23 in case an overvoltage occurs due to an electrostatic discharge, while the current flowing through the transistor 25 has a very low current intensity. The transistor 25 is protected in this manner.

The transistor assembly can be symmetrical and, in particular, can have a plane of symmetry S that runs in the center through the well 2 of the transistor 25. In this case, an additional diode 24, for protection against the switching on of a parasitic bipolar transistor of the transistor 25, can be provided symmetrically to the diode 23 on the side of the transistor well 2 facing away from the diode 23.

Figure 2:
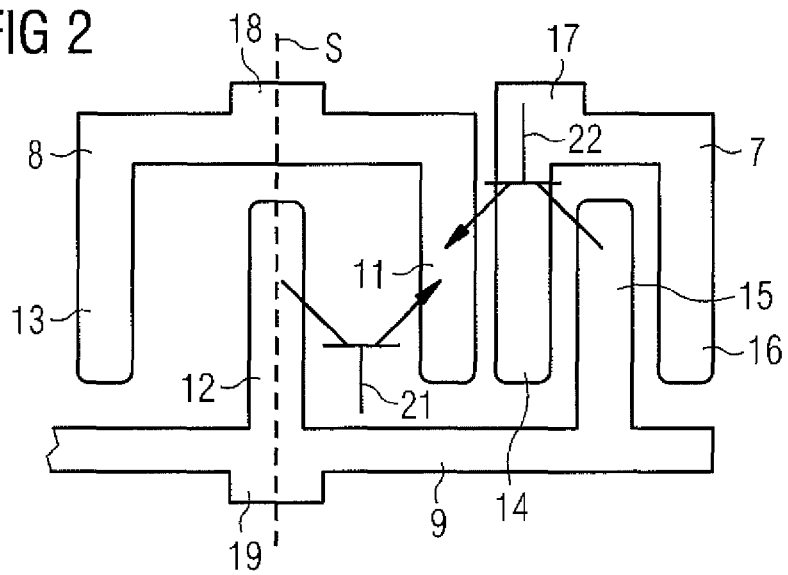
FIG. 2 shows a plan view of the embodiment according to FIG. 1.

FIG. 2 shows a plan view in which the arrangement of connection conductors that constitute the contact connections is recognizable. The following are present: a first connection conductor 11 that electroconductively connects the first doped region 1 of the transistor 25, a second connection conductor 12 on the contact area 20 for the well 2 of the transistor 25, a third connection conductor 13 for the additional doped region 3 of the transistor 25, a fourth connection conductor 14 for the first doped region 4 of the diode 23, a fifth connection conductor 15 on the contact area 50 for the well 5 of the diode 23 and a sixth connection conductor 16 for the additional doped region 6 of the diode 23, as well as a first contact pad 17 of the first contact connection 7, a second contact pad 18 of the second contact connection 8 and a third contact pad 19 of the third contact connection 9.

The first contact connection 7 comprises the fourth connection conductor 14 and the sixth connection conductor 16, which form an electrical terminal of the diode 23, as well as the first contact pad 17, which can be provided in particular for external electrical connection. The second contact connection 8 comprises the first connection conductor 11 and the third connection conductor 13, which form an electrical source terminal of the transistor in the illustrated embodiment, as well as the second contact pad 18, which can be provided in particular for external electrical connection. The third contact connection 9 comprises the second connection conductor 12, which forms an electrical drain terminal of the transistor in the illustrated embodiment, the fifth connection conductor 15, which forms the second terminal of the diode, and the third contact pad 19, which can be provided in particular for external electrical connection. The second connection conductor 12 and the fifth connection conductor 15 form, by means of the third contact connection 9, an electrically conductive connection between the drain region of the transistor 25 and the diode terminal of the same conductivity type.

The switching symbols of the first parasitic bipolar transistor 21 and the second parasitic bipolar transistor 22 are also drawn in FIG. 2. The parasitic bipolar transistors 21, 22 are formed by the arrangement of the doped wells 2, 5 and regions 1, 3, 4, 6 in the semiconductor material of the substrate 10, as already explained above. The collectors of the parasitic bipolar transistors 21, 22 are the well 2 of the transistor and the well 5 of the diode, which are electroconductively connected to one another via the third contact connection 9 and the associated contact areas 20, 50. The common emitter of the parasitic bipolar transistors 21, 22 is the doped region 1 of the transistor 25, and the common base is the semiconductor material of the second conductivity type from substrate 10 and the doped region 4 of the diode 23, respectively.

Figure 3:
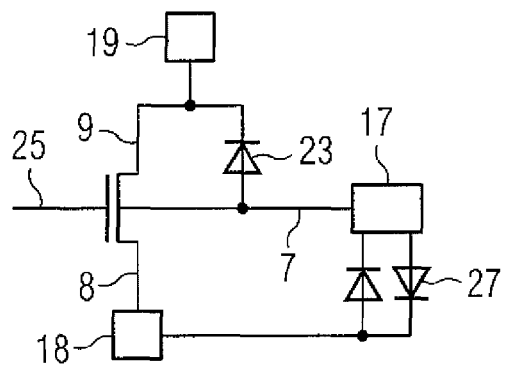
FIG. 3 shows an associated circuit diagram.

FIG. 3 shows a circuit diagram of the transistor assembly. The diode 23 and the transistor 25 are connected to one another via the terminal connections 7, 8, 9 and to the contact pads 17, 18, 19. The circuit diagram of the diode corresponds to an embodiment in which the first conductivity type is n-type and the second conductivity type is p-type. Additional diodes 27, which are formed outside the cross section of FIG. 1 in the substrate 10, for example, can be provided in the circuit between the first contact pad 17 and the second contact pad 18. In the circuit diagram of FIG. 3, the third contact connection 9 corresponds to the collector terminals of the parasitic bipolar transistors 21, 22. The shared emitter terminal of the parasitic bipolar transistors 21, 22 is formed by the second contact connection 8.

The transistor 25 and the diode 23 preferably have finger-shaped terminals, which are arranged in parallel to one another and intercalated in the manner of a comb. The transistor 25 and the diode 23 thus jointly form a multi-collector bipolar transistor with different current gains. The doped regions 1, 4, 6 and the well 5 of the diode can be arranged one after another in the order shown in FIG. 1 and can alternately have the first conductivity type and the second conductivity type. In the described embodiment, the well 5 of the first conductivity type in diode 23 is arranged between the doped region 4 of the second conductivity type in diode 23 and an additional doped region 6 of the second conductivity type in diode 23.

The cathode of the diode and the drain terminal of the transistor can be connected, for example, to an IO terminal, which can be formed in particular by the third contact pad 19. The source terminal can be connected, for example, to a ground terminal, which can be formed by the second contact pad 18. The substrate and the anode of the diode can be connected, for example, to a terminal of the supply voltage that is provided as a substrate terminal.

If an overvoltage appears as a result of an electrostatic discharge that biases the drain terminal relative to the source terminal, the two parasitic bipolar transistors open. Because of the doped well 2 of the transistor, the current gain of the first parasitic bipolar transistor is lower than the current gain of the second parasitic bipolar transistor formed by the diode. A current intensity that would trigger a so-called snap-back inside the transistor is consequently not reached. The diode therefore protects the transistor from damage due to an ESD. This also increases the resistance of the transistor assembly to latch-up. The particularly good protection properties of this transistor assembly result from the dense arrangement of the doped regions of the transistor and the diode in connection with the different dopant concentrations of the wells.

In a suitable configuration of the transistor assembly, the dopant concentration of the diode well can be twice as high as, the dopant concentration of the transistor well. The dopant concentration of the diode well can also be higher, however.

In one configuration of the transistor assembly, the transistor is a high-voltage NMOS transistor.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A transistor assembly comprising:
   a transistor that has a well of a first conductivity type and a doped region of the first conductivity type arranged outside the well; and
   a diode that has an additional well of the first conductivity type and a doped region of a second conductivity type opposite to the first conductivity type arranged outside the additional well, wherein the doped region of the diode is arranged between the diode well and the doped region of the transistor, and the transistor well and the diode well are electroconductively connected to one another, and
   wherein there is a sufficiently small distance between the doped region of the transistor and the diode well, and the transistor well has a sufficiently lower doping than the diode well that a bipolar transistor formed between the transistor well as collector, the doped region of the diode as base and the doped region of the transistor as emitter is configured to have a lower current gain than a bipolar transistor formed by the diode well as collector, the doped region of the diode as base and the doped region of the transistor as emitter,
   wherein only one pn junction is present on a first path leading from the doped region of the transistor nearest the diode to the doped region of the diode,
   wherein only one pn junction is present on a second path leading from the transistor well, through a substrate made of semiconductor material below the doped region of the transistor nearest the diode, and to the doped region of the diode nearest the transistor,
   wherein the diode well has a doping that is at least twice as high as the doping of the transistor well, wherein a contact connection connects the transistor well to the diode well, the transistor well not being connected to the doped region of the diode, and wherein on the side of the diode well facing away from the doped region of the diode, the diode has a further doped region of the second conductivity type, the further doped region being electroconductively connected to the doped region of the diode by a further contact connection.

2. The transistor assembly according to claim 1, wherein the first conductivity type is n-type and the second conductivity type is p-type.

3. The transistor assembly according to claim 1, wherein the wells and the doped regions are arranged in the substrate made of semiconductor material of the second conductivity type.

4. The transistor assembly according to claim 3, wherein, in order to establish the contact connection, connection conductors and contact pads are provided on the substrate and one of these connection conductors is arranged on a contact area of the well of the transistor and another of these connection conductors is arranged on a contact area of the well of the diode.

5. The transistor assembly according to claim 4, wherein the connection conductors are formed in finger shapes and are arranged parallel to one another and the contact connections are thereby intercalated with one another in the manner of a comb.

6. The transistor assembly according to claim 1, wherein the well of the transistor is provided as a drain and the doped region of the transistor is provided as a source.

7. The transistor assembly according to claim 1, wherein the transistor has an additional doped region of the first conductivity type on the side of the well facing away from the doped region and electroconductively connected to the doped region.

8. The transistor assembly according to claim 1, wherein there is another diode on a side of the transistor facing away from the diode and the arrangement of the transistor and the diodes is mirror-symmetrical with respect to a plane of symmetry running through the well of the transistor.

\* \* \* \* \*